Feb. 25, 1969 W. P. DUGAN ET AL 3,429,037

METHOD OF MAKING TUBULAR SOLDER CONNECTORS

Filed Aug. 1, 1966

INVENTORS.

WILLIAM P. DUGAN,
EUGENE G. FREEHAUF,

By L E Carnahan
AGENT.

3,429,037
Patented Feb. 25, 1969

3,429,037

METHOD OF MAKING TUBULAR SOLDER CONNECTORS

William P. Dugan and Eugene G. Freehauf, Ontario, Calif., assignors to General Dynamics Corporation, Pomona, Calif., a corporation of Delaware Filed Aug. 1, 1966, Ser. No. 569,257
U.S. Cl. 29—625 7 Claims
Int. Cl. H05k *3/06, 3/34;* B23p *17/00*

ABSTRACT OF THE DISCLOSURE

A method for producing solder coated tubular members which are integral with a circuit carrying board; the tubular members being adapted to receive component leads which may then be soldered for interconnection with as associated circuit path.

Figures 1, 2, 3, 4, 5, 6, 7:
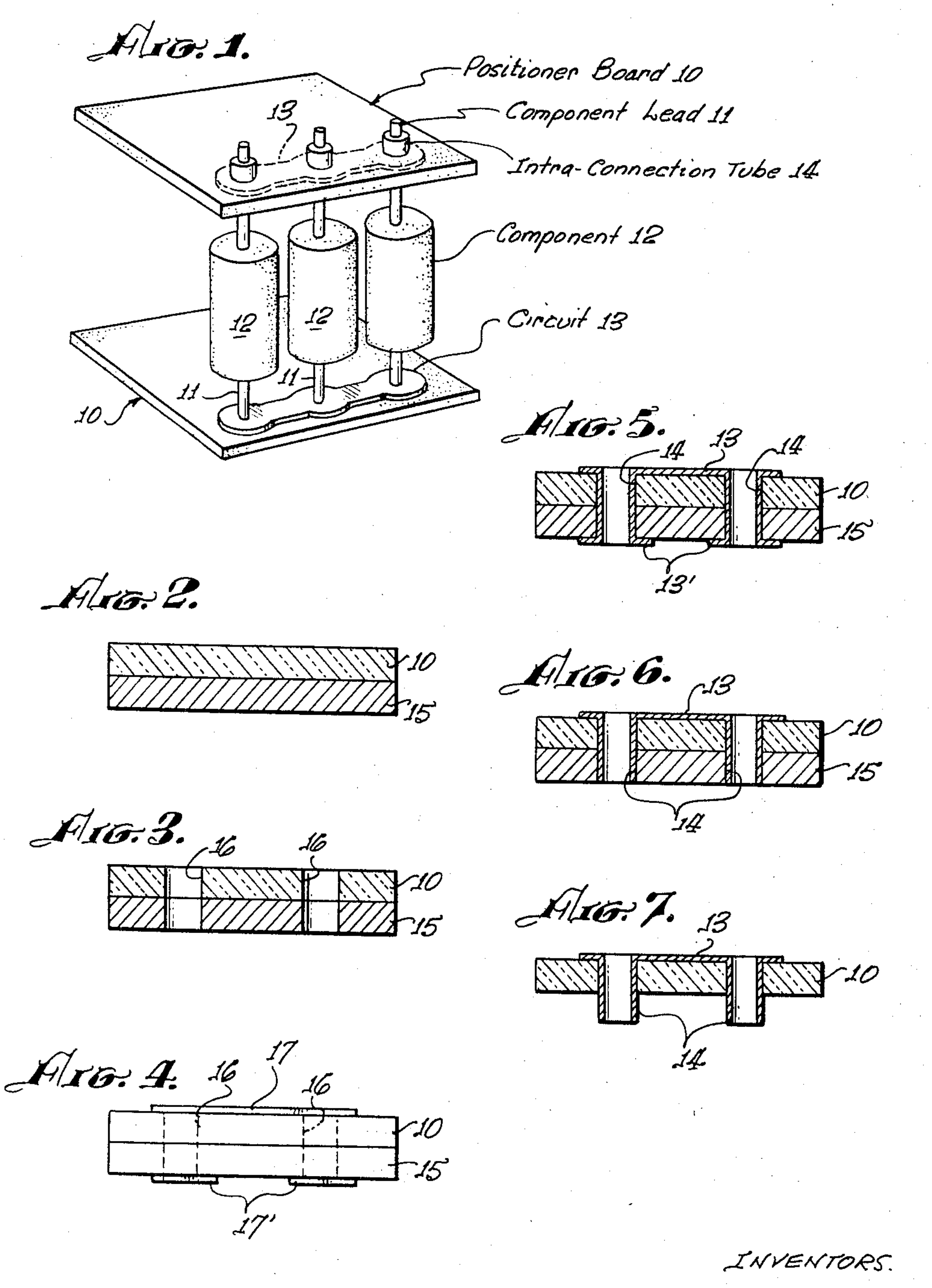

Devices which serve as a media for attaching electronic component leads to a circuit path in apparatus such as 3-D module construction are well known. The end result of this invention is a circuit path on a carrier board with tubular solder connectors (unitubes) at appropriate places in continuity with these circuits. The function of these tubular connectors is to receive component leads so that they may be soldered to the circuit path, as in construction of electronic devices. This invention pertains to the method of manufacturing or creating these solder-containing tubular connectors.

Therefore, it is an object of this invention to provide a method of manufacturing electrical connectors.

A further object of the invention is to provide a unique method of manufacturing devices which serve as a media for attaching electronic component leads.

Another object of the invention is to provide a manufacturing method for producing integral carrier boards and electronic connector devices.

Another object of the invention is to provide a method of manufacturing tubular solder connectors integral with carrier boards and circuits thereon for attaching component leads or the like to desired circuits.

Another object of the invention is to provide a method of manufacturing devices which contain at least one circuit path on a carrier board with tubular solder connectors integral therewith at appropriate places in the carrier board.

Other objects of the invention will become readily apparent from the following description and accompanying drawings wherein:

FIG. 1 is a view illustrating an application of the electrical connectors made in accordance with this invention; and FIGS. 2–7 illustrate certain of the steps of the inventive method.

Broadly, the present invention relates to a method for producing solder-contained tubular members which are integral with a circuit carrying board, the tubular members being adapted to receive component leads or the like which may then be soldered for interconnection with an associated circuit path. The inventive method essentially comprises the steps of: bonding an epoxy glass laminate to an aluminum sheet of the same thickness as the desired tubular member height; drilling holes through the bonded pieces at those positions where a tubular member is desired; plating with copper all exposed aluminum surfaces and thereafter all of the desired surfaces to appropriate thickness; silk screening the desired circuit image on both sides of the copper plated assembly and leaving the resist intact; plating all surfaces with solder to the desired thickness; removing the resist and chemically or otherwise removing the copper not necessary to the final board unit; and dissolving the aluminum laminate as by an immersion of the entire unit in sodium hydroxide.

Referring now to the drawing, FIG. 1 illustrates an application of the invention wherein carrier boards 10 constructed of suitable insulation material and made in accordance with the novel method are intra-connected with leads 11 of a plurality of components 12. Integral with each board 10 are a circuit path 13 interconnecting the component leads 11 and intro-connecting tubular members 14 through which the component leads extend. The circuit path 13 in the upper board is underneath the board 10 as shown in dotted lines while the tubular member connectors 14 in the lower board 10 extend under the board and thus are not shown but are the same as shown extending from the top surface of the upper board. Component leads 11 and tubular members 14 are interconnected by soldering with the members 14 containing their own solder, thus eliminating the need for an external solder source.

The sequence of operation for carrying out the novel method, as partially illustrated in FIGS. 2–7, is as follows:

(1) Bond together a sheet of stage "B" epoxy glass laminate 10, cured to the thickness of the desired carrier board, and a sheet of aluminum 15, having a thickness of the desired height of the tubular members 14 (see FIG. 2).

(2) As shown in FIG. 3, drill holes 16 of appropriate size (approximately 0.014 inch larger than the cooperating component lead diameter) through the bonded assembly at those places requiring a tubular member 14.

(3) Electro copper plate all exposed aluminum surfaces to a thickness of approximately 0.0004 inch.

(4) Electroless copper plate all surfaces to a thickness or approximately 0.0001 inch.

(5) Electro copper plate all surfaces to a thickness of approximately 0.002 inch.

(6) Silk screen the required circuit paths 17 and 17′ on sheets 10 and 15 (see FIG. 4), the top circuit path 17 being the actual circuit path, the bottom path 17′ being a dummy to ensure even plating.

(7) Electroplate with solder all surfaces to the required wall thickness of the tubular members 14 (see FIG. 5), for example, approximately 0.0055 inch. The circuit paths 17 and 17′ of step 6 above are now indicated by 13 and 12′, respectively, since the circuit paths are now plated with solder.

(8) Remove resists applied by silk screening with suitable well-known solvent.

(9) Remove exposed copper from sheets 10 and 15 chemically by conventional procedures.

(10) Remove the dummary circuits 13′ flush with the surface of aluminum sheet 15 as shown in FIG. 6.

(11) Dissolve the aluminum sheet 15, for example, by immersing in sodium hydroxide leaving the finished product as shown in FIG. 7, with the carrier board 10, circuit 13 and tubular member 14 integrally connected.

The configuration of the circuit 13, the inside diameter of the tubular members 14 and the positioning of the members 14 are determined by the specific requirements of any specific application.

It has thus been shown that the present invention provides a unique method of manufacturing media for attaching electronic component leads to a circuit path having the following advantages: the tubular members are an integral part of the carrier board, thus capable of standing more abuse; no chance of mismatch between the carrier board holes and the connector member; all circuit and tubular member locations may be transposed directly from engineering drawings, thus eliminating "hard tooling" for limited production; tubular member height easily controlled because it is determined by stable material, which can be varied in thickness; diameters can be varied to accept different size component leads; increases the number of circuits per given volume; provides a non-contaminatable joint; joints can be easily repaired; provides a suitable electrical connection where welding is not feasible; the tubular member acts as a heat sink to keep heat away from critical components; contains own solder, thus no external solder source is required; can be applied to single-layer or multi-layer circuit boards; provides a connector device which imbeds the component lead in a column of solder the length of the tubular member; and provides a device applicable to either multiple joint or manual soldering.

Although a particular embodiment of the invention has been illustrated and described, modifications will become apparent to those skilled in the art, and it is intended to cover in the appended claims all such modifications as come within the true spirit and scope of the invention.

What we claim is:

1. The method of manufacturing electrical connectors of the type having an integral carrier board, at least one circuit and solder coated tubular member comprising the steps of: bonding together a layer of epoxy glass insulation material and a layer of aluminum, the insulation material layer having the thickness of the desired carrier board and the aluminum layer having the thickness of the desired tubular member, drilling apertures of a size larger than the internal diameter of the desired tubular members through the thus bonded assembly at the places requiring a tubular member; electro copper plating all exposed aluminum surfaces to a desired thickness; electroless copper plating all surfaces to a desired thickness; electro copper plating all surfaces to a desired thickness; defining desired circuits on opposite surfaces of the assembly by utilizing a silk screen procedure; electroplating with solder all surfaces to a desired thickness; removing the resist applied by the silk screening procedure; chemically removing the exposed copper from the assembly; removing the circuits from the side of the assembly adjacent the aluminum layer so that the placed apertures are substantially flush with the aluminum layer; and dissolving the aluminum layer, whereby the desired number of solder coated copper tubular members extend from the insulation material and are integral therewith and with the circuitry thereon.

2. The method defined in claim 1, wherein the apertures are drilled to a size about 0.014 inch larger than the component lead to be utilized therewith.

3. The method defined in claim 1, wherein the exposed aluminum is plated to a thickness of about 0.0004 inch.

4. The method defined in claim 1, wherein the surfaces are electroless copper plated to a thickness of about 0.0001 inch.

5. The method defined in claim 1, wherein the copper surfaces are electro copper plated to a thickness of about 0.002 inch.

6. The method defined in claim 1, wherein the electro-copper surfaces are plated with solder to define a thickness of about 0.005 inch.

7. The method defined in claim 1, wherein the aluminum layer is dissolved by immersing in sodium hydroxide.

References Cited

UNITED STATES PATENTS

| | | | |
|---|---|---|---|
| 3,040,426 | 6/1962 | Hamren. | |
| 3,163,588 | 12/1964 | Shortt et al. | 29—625 X |
| 3,261,769 | 7/1966 | Coe et al. | |
| 3,345,741 | 10/1967 | Reimann | 29—626 |
| 3,357,099 | 12/1967 | Nagy et al. | 29—625 |

JOHN F. CAMPBELL, *Primary Examiner.*

D. C. REILEY, *Assistant Examiner.*

U.S. Cl. X.R.

29—423, 626, 527